United States Patent [19]

Kinashi et al.

[11] 4,342,820

[45] Aug. 3, 1982

[54] DRY PLANOGRAPHIC PRINTING PLATE AND PREPARATION THEREOF

[75] Inventors: Takao Kinashi, Otsu; Takashi Fujita, Kusatsu; Norio Kawabe, Otsu, all of Japan

[73] Assignee: Toray Industries, Inc., Tokyo, Japan

[21] Appl. No.: 215,100

[22] Filed: Dec. 10, 1980

[51] Int. Cl.³ .............................................. G03C 1/68
[52] U.S. Cl. ...................................... 430/11; 430/14; 430/166; 430/272; 430/303; 101/453
[58] Field of Search ............... 430/272, 303, 166, 11, 430/14; 101/453

[56] References Cited

U.S. PATENT DOCUMENTS

| | | | |
|---|---|---|---|
| 3,511,172 | 5/1970 | Curtin | 101/450 |
| 3,677,178 | 7/1972 | Gipe | 430/272 |
| 3,933,495 | 1/1976 | Kendo et al. | 430/300 |
| 4,164,422 | 8/1979 | Okai et al. | 430/272 |
| 4,254,209 | 3/1981 | Abe et al. | 430/272 |

FOREIGN PATENT DOCUMENTS 1444381 7/1976 United Kingdom .
2034911 6/1980 United Kingdom .

*Primary Examiner*—Jack P. Brammer
*Attorney, Agent, or Firm*—Scully, Scott, Murphy and Presser

[57] ABSTRACT

Provided is a presensitized planographic printing master plate requiring no dampening water for use in negative work which comprises a base substrate, a light releasing photosensitive layer overlying the base substrate and a silicone rubber layer overlying the photosensitive layer. When the printing master plate is exposed through a negative film and then treated with a developer, only the silicone rubber layer overlying the exposed photosensitive layer is removed, while the photosensitive layer remains as it is to form an image area. Dampening water is not required when printing is carried out.

9 Claims, No Drawings

DRY PLANOGRAPHIC PRINTING PLATE AND PREPARATION THEREOF

BACKGROUND OF THE INVENTION

This invention relates to a dry planographic printing plate and a method of making same. More particularly, it is concerned with a new type of a negative working presensitized planographic printing plate for use in dry planography and a method of making same.

Heretofore, there have been made several proposals as to a negative working dry planographic printing plate comprising a silicone rubber layer which overlies a photosensitive layer overlying a base substrate.

For example, in Japanese Patent Publication No. 16044/1971 there is proposed a presensitized planographic printing plate comprising a silicone rubber layer adhered by an adhesive layer to a light solubilizable diazonium type photosensitive layer overlying an aluminum plate. The plate is exposed to actinic light through a negative film to solubilize the photosensitive layer of the exposed area, then using a developer the solubilized photosensitive layer is dissolved off and at the same time the overlying silicone rubber layer is removed to allow the aluminum plate as a base substrate to be exposed as an image area.

Also in Japanese Patent Laid Open Publications Nos. 8306/1974 and 7320/1974 and Japanese Patent Application No. 131797/1978 there is proposed a negative working dry planographic printing plate having the same construction as above wherein the solubilized photosensitive layer and the overlying silicone rubber layer are removed by development and the exposed portion of the base substrate constitutes an image area.

In those proposed printing plates, the image area has a similar structure to that of a deep etched plate wherein the ink receiving portion consists of recesses (hereinafter referred to as "cell(s)") formed by the removal of the solubilized photosensitive layer and the overlying silicone rubber layer. In such a printing plate, it has heretofore been necessary to feed a larger amount of ink onto the printing plate in order to let ink adhere sufficiently to the cell portion at the time of printing. This, however, results in a large increase in the volume of ink consumption, leading not only to an increase in the printing cost but also to a serious problem in point of printing effect, namely in the reproduction of gradation. For example, in the case of feeding ink onto a printing plate so as to give a desirable optical density of the so-called solid portion of the resulting printed matter, the ink is not sufficiently transferred from the form roller of a printing machine into the cells on the plate forming a dot image of the so-called highlight portion of the printed matter, particularly into the cells forming very small dots of a diameter of the order of several ten microns. Thus the dots of the printed matter tend to get out of shape, or sometimes dot omission occurs in the printed matter due to no transfer of ink into the cells.

On the other hand, if the amount of ink to be fed onto the plate surface is increased in order to eliminate such disorder of dot shape, the optical density of the solid portion becomes too high with loss in printing effect balance, or sometimes there may occur a serious problem associated with the print quality, for example, the dots in the shadow area are not reproduced.

To solve these problems, it may be effective to reduce the film thickness of the photosensitive layer to be dissolved off and thereby make the cell depth smaller. However, it is very difficult and not practical to uniformly form a photosensitive layer having a thickness required to solve the foregoing problems associated with printing, e.g. a film thickness of about $0.1\mu$, and further, thinning the photosensitive layer results in an enhanced physical and chemical influence from the base substrate, for example, the image reproducibility and the preservability are badly influenced in many cases.

Thus, the negative working dry planographic printing plates so far proposed have drawbacks in point of ink adhesion, etc. and are less practical.

SUMMARY OF THE INVENTION

It is an object of this invention to eliminate the above-mentioned disadvantages.

It is another object of this invention to provide a new negative working dry planographic printing plate and a method of making the same.

Other objects and advantages of this invention will become apparent from the following description.

According to this invention, there are provided a negative working presensitized printing plate for use in dry planography, which comprises
(1) a base substrate,
(2) an oleophilic photosensitive layer secured to and overlying said base substrate, and
(3) an ink repelling silicone rubber layer secured to and overlying said photosensitive layer,
said photosensitive layer being substantially insoluble in a developer bath before and after the exposure to the actinic light, and being capable of releasing said silicone rubber layer in a selected area to be exposed to the actinic light, and said silicone rubber layer being capable of being removed in said exposed image area by a developer; a negative working presensitized planographic printing plate for use in dry planography, comprising an image area constituted by a photosensitive layer overlying a base substrate, and an non-image area constituted by a silicone rubber layer overlying said photosensitive layer; and a method of making a negative working presensitized planographic printing plate for use in dry planography, which method comprises image-wise exposing a printing master, said printing master comprising a base substrate, a photosensitive layer being difficult to dissolve or insoluble in a developer and overlying said base substrate and a silicone rubber layer overlying said photosensitive layer, and subsequently treating the exposed printing master with the developer to allow only the exposed image areas of the silicone rubber layer to be removed.

DETAILED DESCRIPTION OF THE INVENTION

The photosensitive layer used in this invention is difficult to dissolve or insoluble in a developer, that is, it is a light releasing layer, which on developing allows only the overlying silicone rubber layer to be removed, leaving the exposed portion of the photosensitive layer as it is without substantial removal thereof.

Such a light releasing layer is obtained by rendering a known light-solubilizable photosensitive compound difficult to dissolve or insoluble in a developer by cross-linking the said compound with a polyfunctional compound or by modifying a functional group contained in the said compound with a monofunctional compound. By way of illustrating the said light-solubilizable photosensitive compound, mention may be made of quinonediazides usually employed for positive working presensitized plate, wipe-on plate or photoresist, such as the esters obtained from benzoquinone-1,2-diazide sulfonates or naphthoquinone-1,2-diazide sulfonates and polyhydroxy compounds, e.g. benzoquinone-1,2-diazide sulfochloride with polyhydroxyphenyl, the ester from naphthoquinone-1,2-diazide sulfochloride and pyrogallol acetone resin, and the ester from naphthoquinone-1,2-diazide sulfochloride and phenol-formaldehyde novolak resin, or complexes of diazonium compounds and inorganic or organic acids, e.g. a photosensitive complex of diazodiphenylamine and phosphotungstic acid.

As the method of introducing a cross-linked structure into such a light-solubilizable photosensitive compound, mention may be made of a method wherein reactive groups, e.g. hydroxyl and amino, contained in the said photosensitive compound are cross-linked with a polyfunctional cross-linking agent.

Examples of such cross-linking agent are polyisocyanate compounds, e.g. paraphenylene diisocyanate, 2,4- or 2,6-toluene diisocyanate, 4,4'-diphenylmethane diisocyanate, hexamethylene diisocyanate, isophorone diisocyanate, or adducts thereof, and polyepoxy compounds, e.g. polyethylene glycol diglycidyl ethers, polypropylene glycol diglycidyl ethers, bisphenol A diglycidyl ether, and trimethylolpropane triglycidyl ether. It is necessary that the curing operation with these cross-linking agents be carried out under conditions under which the photosensitive substance will not lose its photosensitivity, usually at a temperature not higher than 120° C. To this end, a catalyst or the like is used.

Another method of rendering such light-solubilizable photosensitive compound difficult to dissolve or insoluble in a developer involves, for example, urethanizing, esterifying or amidizing a functional group contained in the said photosensitive compound. The compound to be reacted with such functional group of the photosensitive compound may be either a low molecular or relatively high molecular compound. Alternatively, a vinyl monomer may be graft-polymerized to the photosensitive compound.

A specially preferred photosensitive layer used in this invention is obtained by cross-linking or modifying a partial ester from naphthoquinone-1,2-diazide-5-sulfochloride and phenol-formaldehyde novolak resin with a poly- or mono-functional isocyanate.

In the photosensitive layer may be incorporated other components with a view to improving the film forming property or the adhesion to the base substrate, or dyestuffs for making image visible at the time of development or exposure, provided that such incorporation should not spoil the effect of this invention.

The thickness of the light releasing layer used in this invention is in the range of about 0.1 to 100μ, preferably from about 0.5 to 10μ. A smaller thickness is likely to cause defects such as the formation of pinholes at the time of coating, while a larger thickness is disadvantageous from the economic point of view.

The silicone rubber layer used in this invention consists mainly of a linear organopolysiloxane of several thousand to several hundred thousand molecular weights having the following repeating unit:

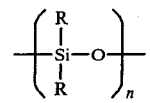

wherein n is an integer not less than 1 and R is $C_1$ to $C_{10}$ alkyl, alkenyl or phenyl with 60% or more of R being preferably methyl group. Such a linear organopolysiloxane may be mixed with an organic peroxide and heat-treated to give a scarcely cross-linked silicone rubber.

Also added to the linear organopolysiloxane is a cross-linking agent which is the so-called room temperature (low temperature) vulcanizing type used for silicone rubber, e.g. acetoxysilanes, ketoximosilanes, alkoxysilanes, aminosilanes and amidesilanes. Using these cross-linking agents in combination with a hydroxyl-terminated linear organopolysiloxane respectively afford deacetic acid type, deoxime type, dealcohol type, deamine type and deamide type silicone rubbers. To these silicone rubbers, in general, is further added a small amount of an organotin compound or the like as a catalyst.

The thickness of the silicone rubber layer ranges from about 0.5 to 10μ. A smaller thickness may cause problems in point of printing endurance, while a larger thickness is not only disadvantageous from the economic point of view but also is counter to one of the objects of the invention that the cell is to be made shallow, and further it becomes difficult to remove the silicone rubber layer at the time of development which leads to inferior image reproducibility.

In the planographic printing plate of this invention, the adhesion between the base substrate and the photosensitive layer and that between the photosensitive layer and the silicone rubber layer are so important for the fundamental plate performances such as image reproducibility and printing endurance that, if required, there may be formed an adhesive layer between the above layers, or an adhesion improving component may be incorporated in each of the above layers. Particularly for the bonding between the photosensitive layer and the silicone rubber layer, it is effective to provide therebetween a known silicone primer or silane coupling agent layer, or incorporate a silicone primer or silane coupling agent into the photosensitive layer or the silicone rubber layer.

The base substrate should be flexible enough to be set in a conventional planographic printing machine and be strong enough to withstand the load applied in printing, typical of which are metallic plates such as aluminum, copper and steel, plastic films such as polyethylene terephthalate, and coated papers. A further coating may be applied onto these sheets for the prevention of halation or for other objects, and the so-coated sheets may be used as the base substrate.

To protect the silicone rubber layer as the surface layer of the dry planographic printing plate constructed as above, or for other purposes, a thin protective film may be laminated on the surface of the silicone rubber layer.

The hereinabove-described dry planographic printing plate based on this invention is manufactured for example in the following manner. First, onto the base substrate is applied a solution of a photosensitive layer forming composition by the use of a conventional coater such as reverse roll coater, air knife coater or Mayer bar coater, or a rotary applicator such as whirler, followed by drying and if required heat-curing, then, if required after applying an adhesive layer onto the photosensitive layer in the same manner followed by drying, a silicone rubber solution is applied thereonto also in the same manner followed by heat treatment usually at a temperature of 100° to 120° C. for several minutes to allow curing to take place to a satisfactory extent to form a silicone rubber layer. If necessary, the so-formed silicone rubber layer is covered with a protective film by means of a laminator or the like.

The dry planographic printing plate of this invention produced as described in the foregoing, is exposed to actinic light through a negative transparency closely adhered to said plate in vacuo. The light source used for this exposure step should generate abundant ultraviolet rays (light), and mercury lamps, carbon arc lamps, xenone lamps, metal halide lamps or fluorescent lamps may be used as such light source.

Then, the plate after exposure is rubbed with a developing pad containing a developer whereby only the silicone rubber layer of the exposed portion is removed, while the photosensitive layer which has been made difficult to dissolve or insoluble in the developer by cross-linking or modifying remains without substantial reduction of its thickness, with the exposed surface of the photosensitive layer constituting an ink receiving portion.

Suitable developers which may be used in this invention comprise aliphatic hydrocarbons (e.g. hexane, heptane, gasoline, kerosene), aromatic hydrocarbons (e.g. toluene, xylene), or halogenated hydrocarbons (e.g. trichlene), which are capable of swelling silicone rubber, and the following polar solvents incorporated therein:

Alcohols (e.g. methanol, ethanol); Ethers (e.g. ethyl cellosolve, dioxane); Ketones (e.g. acetone, methyl ethyl ketone); Esters (e.g. ethyl acetate, cellosolve acetate).

The principle of image formation by the light releasing, photosensitive layer in this invention is unknown, but is presumed to be based on the change in adhesion of the photosensitive layer to the silicone rubber layer due to change in polarity of the photosensitive layer on exposure or change in swelling property of the photosensitive layer against the developing solvent. The depth of the fine cell as an ink receiving portion of the printing plate obtained in this manner is smaller by the thickness of the photosensitive layer than the depth of the cell in conventional negative working dry planographic printing plate in which the solubilized photosensitive layer of the exposed area is dissolved off and at the same time the overlying silicone rubber layer is removed. The ink receiving portion to be exposed may be formed of a highly ink-receptive resin. For this reason, the use of the planographic printing plate of this invention can afford an extremely good printed matter free from the so-called dot omission.

Furthermore, the image area constituted by the photosensitive layer as the surface layer is easily dyed with dyestuffs, while the non-image area constituted by the silicone rubber layer as the surface area is not dyed, therefore, it is possible to inspect the printing plate with only the image area dyed. When it has become necessary to eliminate the ink receptivity of the image area concerned as a result of proofreading or the like, a silicone rubber solution is applied to the portion concerned to cover the image area with a silicone rubber film. Since the photosensitive layer of the image area is particularly superior in the adhesion to the silicone rubber film formed on the eliminated portion, the latter portion also has an excellent printing endurance.

Working examples of this invention are given below to illustrate the invention more in detail. The parts used therein are all parts by weight.

EXAMPLE 1

(A) Onto a chemical conversion coated aluminum plate (0.3 mm thick, a product of Sumitomo Light Metal Industries) was applied a solution of the following photosensitive layer forming composition, followed by heat treatment for 2 minutes at 120° C., to form a 2.6$\mu$ thick photosensitive layer:

| | |
|---|---|
| (a) Naphthoquinone-1,2-diazide-5-sulfoester of phenol novolak resin ("Sumilightresin PR 50235," a product of Sumitomo Durez Co., Ltd.) with a percent esterification 44% | 100 parts |
| (b) 4,4-diphenylmethane diisocyanate | 20 parts |
| (c) Dibutyl tin dilaurate | 0.2 part |
| (d) Methyl cellosolve acetate | 2000 parts |

Onto the photosensitive layer thus formed was then applied a silicone rubber solution of the following composition, followed by heating for 2 minutes at 120° C. to allow cure to take place, to form a 2.2$\mu$ thick silicone rubber layer:

| | |
|---|---|
| (a) Dimethyl polysiloxane (molecular weight about 80,000, hydroxylterminated) | 100 parts |
| (b) Ethyl triacetoxy silane | 5 parts |
| (c) Dibutyl tin diacetate | 0.2 part |
| (d) $\gamma$-aminopropyl triethoxy silane | 3 parts |
| (e) Iso Par E | 1650 parts |

To the printing master plate thus obtained was closely adhered in vacuo in known manner a negative film having dot image of 175 lines, which was then exposed image-wise for 60 seconds at a distance of 1 m. using a metal halide lamp. The plate was then immersed in a mixed ethanol/Iso Par E (a product of Esso Chemical) (=20/80) solution and rubbed lightly with a developing pad, resulting in that the silicone rubber layer of the exposed area was removed, allowing the surface of the photosensitive layer to be exposed, to give an image true to the original film.

The printing plate thus obtained was checked for the surface condition with a stylus type surface roughness tester (TALYSURF, a product of Teijin Shoji) to find that the surface of the photosensitive layer of the area exposed on development was very smooth and the thickness of the photosensitive layer was not reduced, which was 2.6$\mu$.

(B) On the other hand, on the same aluminum plate as that described above was formed a photosensitive layer of the following composition so that the thickness thereof was 2.6$\mu$, followed by heat treatment for 2 minutes at 120° C.:

(a) Naphthoquinone-1,2-diazide-5-sulfoester of phenol novolak resin (Sumilightresin PR 50235, a product of Sumitomo Durez Co., Ltd.) with a percent esterification 44%

Then, on the so-formed photosensitive layer was formed the same silicone rubber layer as that described in the above (A) so as to give the same thickness, followed by heat treatment for 2 minutes at 120° C. Subsequent exposure and development in the same manner as in the above (A) allowed the photosensitive layer of the exposed area to be dissolved off and at the same time the overlying silicone rubber layer to be removed leaving an exposed aluminum plate, to give a printing plate.

The printing plates obtained in the above (A) and (B) were each attached to an offset press ("Komori Sprint 2 Color") and a printing was made using "Aqualess ST Cyan" (a product of Toyo Ink Mfg. Co.) without using dampening water. The printing was made on levels from about 2.0 to 0.7 of the optical density of the solid portion on the printed matter, while the adhesion of ink in the highlight area (dot dia. 50–70μ) was observed with the eyes through a magnifier (50X). As a result, the optical density of the solid portion at which the adhesion of ink became poor (somewhat or complete omission of dot) was found to be 0.8 to 0.9 in the plate (A) and 1.3 to 1.4 in the plate (B). In the same amount of ink, the plate (A) exhibited a remarkable improvement in the adhesion of ink to the dot area.

EXAMPLE 2

Onto a 0.24 mm thick aluminum plate (a product of Sumitomo Light Metal Industries) was applied a resol resin ("Sumilightresin PC-1," a product of Sumitomo Durez Co., Ltd.) so as to give a 2μ thickness, followed by heat treatment at 180° C. for 3 minutes to allow cure to take place, to give a base substrate. Then, a solution of the following photosensitive layer composition was applied onto the base substrate and was cured by heating at 120° C. for 2 minutes to form a 2.4μ thick photosensitive layer:

| | |
|---|---|
| (a) Naphthoquinone-1,2-diazide-5-sulfoester of phenol novolak resin (the one described in Example 1) | 100 parts |
| (b) 2,6-toluene diisocyanate | 20 parts |
| (c) Dibutyl tin laurate | 0.2 part |
| (d) Dioxane | 2000 parts |

Then, a silicone rubber solution of the following composition was applied onto the photosensitive layer and was cured by heating at 120° C. for 2 minutes to form a 2.1μ thick silicone rubber layer:

| | |
|---|---|
| (a) Dimethyl polysiloxane (molecular weight about 80,000, hydroxylterminated) | 100 parts |
| (b) Vinyl tri(methylethylketoximo)silane | 8 parts |
| (c) Dibutyl tin diacetate | 0.2 part |
| (d) γ-[N-(β-aminoethyl)amino]propyl trimethoxy silane | 2.5 parts |
| (e) Iso Par E | 1800 parts |

The printing master plate thus obtained was exposed for 60 seconds at a distance of 1 meter using a metal halide lamp through a negative film having dot image of 150 lines adhered closely in vacuo to the plate. The plate was then immersed in a developer (Iso Par E/ethanol=9/1) containing a dye (oil Blue A) and rubbed lightly with a developing pad, resulting in that only the silicone rubber layer of the exposed area was removed and there was obtained a printing plate having an exposed dyed photosensitive layer exactly reproducing the image of the negative film.

EXAMPLE 3

To 30 ml. of dry dioxane were added under $N_2$ gas stream 10 g. of phenyl isocyanate and 20 mg. of dibutyl tin dilaurate, then 7 g. of naphthoquinone-1,2-diazide-5-sulfoester of phenol novolak with a percent esterification 43% was added with stirring. The stirring was continued for 3 hours at room temperature. The after standing overnight, 1 ml. of water was added to allow remaining phenyl isocyanate to decompose. The reaction mixture was filtered to remove the precipitate. The filtrate was then put into a large excess of water to allow precipitation to take place, followed by filtration and drying to give a yellow powder.

The naphthoquinone-1,2-diazide-5-sulfoester of phenol novolak resin thus modified with phenyl isocyanate was dissolved in dioxane to prepare a 5 wt.% solution. This solution was applied onto a 0.3 mm thick chemical conversion coated aluminum plate and then dried to give a 2.2μ thick photosensitive layer, on which layer was then applied a silicone rubber layer in just the same manner as in Example 2. The printing master plate thereby obtained was exposed for 60 seconds at a distance of 1 meter using a metal halide lamp through a negative film having dot image of 150 lines adhered closely in vacuo to the plate. The plate was then soaked in a mixed Iso Par E/ethanol (=9/1) solution and rubbed with a developing pad, resulting in that only the silicone rubber layer of the exposed area was removed leaving exposed photosensitive layer, which constituted a true image to the original film.

The printing plate thus obtained was checked for the surface condition with a stylus type surface roughness tester (TALYSURF, a product of Teijin Shoji) to find that the surface of the photosensitive layer of the area exposed on development was smooth and the thickness of the photosensitive layer was 2.2μ.

EXAMPLE 4

Using each of the printing plates obtained in Examples 1(A), 2 and 3, a printing was made with "Aqualess ST Magenta" (a product of Toyo Ink Mfg., Co.) without using dampening water by means of an offset press ("Davidson Dualith 700"). As a result, all of the printing plates afforded beautiful printed matters and even after printing 20,000, 10,000 and 10,000 copies respectively their surfaces were free from damage, showing capability of further printing.

We claim:
1. A negative working presensitized printing plate for use in dry planography, which comprises
    (1) a base substrate,
    (2) an oleophilic photosensitive layer secured to and overlying said base substrate, and
    (3) an ink repelling silicone rubber layer secured to and overlying said photosensitive layer,
said photosensitive layer further comprising a component selected from the group consisting of a quinonediazide cross-linked with a polyfunctional compound, a quinonediazide urethanized with a monoisocyanate, an esterified quinonediazide, an amidized quinonediazide a quinonediazide graft polymerized with a vinyl monomer, so that said photosensitive layer is substantially insoluble in a developer, capable of releasing said silicone rubber layer and constituting an image area in a selected area to be exposed to the actinic light, and so that said silicone rubber layer is capable of being removed in said exposed image area by said developer and constituting a non-image area in an area unexposed to the actinic light.

2. The plate as defined in claim 1, in which said photosensitive layer is made difficult to dissolve or insoluble in the developer by cross-linking a quinonediazide compound with a polyfunctional compound.

3. The plate as defined in claim 1, in which said polyfunctional compound is a polyisocyanate compound.

4. The plate as defined in claim 1, in which said polyfunctional compound is a polyepoxy compound.

5. The plate as defined in claim 1 in which said quinonediazide compound is naphthoquinone-1,2-diazide-sulfonate with polyhydroxy compound.

6. The plate as defined in claim 5, in which said polyhydroxy compound is a phenol-formaldehyde novolak resin.

7. The plate as defined in claim 1 in which the thickness of said photosensitive layer is in the range of from 0.1 to 100μ.

8. The plate as defined in claim 1 in which said silicone rubber layer comprises a cross-linked diorganopolysiloxane obtained by curing diorganopolysiloxane having the following repeating unit:

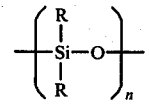

wherein n is an integer not less than 1 and Rs, which may be alike or different, are each $C_1$ to $C_{10}$ alkyl, alkenyl or phenyl with 60% or more of R being methyl group.

9. The plate as defined in claim 1 in which the thickness of said silicone rubber layer is in the range of from about 0.5 to 10μ.

* * * * *

UNITED STATES PATENT AND TRADEMARK OFFICE
CERTIFICATE OF CORRECTION

PATENT NO. : 4,342,820

DATED : August 3, 1982

INVENTOR(S) : Takao Kinashi, et al.

It is certified that error appears in the above-identified patent and that said Letters Patent is hereby corrected as shown below:

Column 2, line 31, "bath" should read -- both --.

Signed and Sealed this

Twenty-third Day of November 1982

[SEAL]

Attest:

GERALD J. MOSSINGHOFF

Attesting Officer

Commissioner of Patents and Trademarks

UNITED STATES PATENT AND TRADEMARK OFFICE
CERTIFICATE OF CORRECTION

PATENT NO. : 4,342,820
DATED : August 3, 1982
INVENTOR(S) : Takao Kinashi, et al It is certified that error appears in the above-identified patent and that said Letters Patent is hereby corrected as shown below:

Column 3, line 3, delete "the esters obtained from";
line 4, delete "and" and insert therefor -- with --;
line 5, before "benzoquinone" insert -- the ester from --;

Signed and Sealed this

Nineteenth Day of April 1983

[SEAL]

Attest:

GERALD J. MOSSINGHOFF

Attesting Officer   Commissioner of Patents and Trademarks